(12) United States Patent
Choulis et al.

(10) Patent No.: US 7,772,761 B2
(45) Date of Patent: Aug. 10, 2010

(54) ORGANIC ELECTROPHOSPHORESCENCE DEVICE HAVING INTERFACIAL LAYERS

(75) Inventors: Stelios A. Choulis, San Jose, CA (US); Mathew Mathai, Santa Clara, CA (US); Vi-En Choong, San Jose, CA (US); Franky So, Gainesville, FL (US)

(73) Assignee: Osram Opto Semiconductors GmbH, Regensburg (DE)

( * ) Notice: Subject to any disclaimer, the term of this patent is extended or adjusted under 35 U.S.C. 154(b) by 553 days.

(21) Appl. No.: 11/238,888

(22) Filed: Sep. 28, 2005

(65) Prior Publication Data

US 2007/0069636 A1 Mar. 29, 2007

(51) Int. Cl.
*H05B 33/00* (2006.01)

(52) U.S. Cl. ..................... 313/504; 313/506

(58) Field of Classification Search ......... 313/504–512; 445/23–25
See application file for complete search history.

(56) References Cited

U.S. PATENT DOCUMENTS

| | | | | |
|---|---|---|---|---|
| 6,399,224 | B1* | 6/2002 | Li ........................... | 428/690 |
| 6,717,358 | B1* | 4/2004 | Liao et al. ............... | 313/504 |
| 6,830,828 | B2* | 12/2004 | Thompson et al. ....... | 428/690 |
| 6,902,830 | B2* | 6/2005 | Thompson et al. ....... | 428/690 |
| 7,242,141 | B2* | 7/2007 | Pschenitzka ............. | 313/506 |
| 7,291,406 | B2* | 11/2007 | Thompson et al. ....... | 428/690 |
| 2002/0121860 | A1* | 9/2002 | Seo et al. ................. | 313/506 |
| 2004/0101618 | A1 | 5/2004 | Ottermann et al. | |
| 2004/0178414 | A1* | 9/2004 | Frey et al. ................ | 257/79 |
| 2005/0046337 | A1* | 3/2005 | Chin et al. ............... | 313/504 |
| 2005/0064231 | A1* | 3/2005 | Towns et al. ............. | 428/690 |
| 2005/0067638 | A1* | 3/2005 | Gupta et al. .............. | 257/290 |
| 2005/0123789 | A1* | 6/2005 | Vargas et al. ............. | 428/690 |
| 2005/0158579 | A1* | 7/2005 | Marks et al. ............. | 428/690 |
| 2005/0221120 | A1* | 10/2005 | Owczarczyk et al. .... | 428/690 |
| 2006/0147736 | A1* | 7/2006 | Jung et al. ................ | 428/473.5 |
| 2006/0241202 | A1* | 10/2006 | Wallace .................... | 523/1 |
| 2007/0296332 | A1* | 12/2007 | Thompson et al. ....... | 313/504 |
| 2008/0001512 | A1* | 1/2008 | Nomura .................... | 313/307 |
| 2008/0007164 | A1* | 1/2008 | Suzuki et al. ............. | 313/504 |
| 2008/0018221 | A1* | 1/2008 | Egen et al. ................ | 313/483 |
| 2008/0067924 | A1* | 3/2008 | Prakash et al. ........... | 313/504 |

OTHER PUBLICATIONS

Xiaohui Yang et al., "Highly Efficient Single-Layer Polymer Electrophosphorescent Devices", Jan. 16, 2004, Advanced Materials, 16, No. 2, 161-166 pp.

Shih-Chun Lo et al., "Green Phosphorescent Dendrimer for Light-Emitting Diodes", Jul. 4, 2002, Advanced Materials, 14, No. 13-14, 975-979.

Mitsunori Suzuki et al., "Highly efficient polymer light-emitting devices using ambipolar phosphorescent polymers", 2005, Applied Physics Letters 86, 103507, 3 pp.

(Continued)

*Primary Examiner*—Joseph L Williams
(74) *Attorney, Agent, or Firm*—Fish & Richardson P.C.

(57) ABSTRACT

Techniques are described for forming an organic light emitting diode device with improved device efficiency. Materials having at least one energy level that is similar to those of a phosphorescent light emitting material in the diode are incorporated into the device to directly inject holes or electrons to the light emitting material.

31 Claims, 5 Drawing Sheets

OTHER PUBLICATIONS

Brian W. D'Andrade et al., "White Organic Light-Emitting Devices for Solid-State Lighting", Sep. 16, 2004, Advanced Materials, 16, No. 18, 1585-1595 pp.

M.A. Baldo et al., "Highly efficient phosphorescent emission from organic electroluminescent devices", Sep. 10, 1994, Nature, vol. 395, 151-154.

G.E. Jabbour et al., "High $T_g$ Hole Transport Polymers for the Fabrication of Bright and Efficient Organic Light-Emitting Devices with an Air-Stable Cathode", Jan. 2000, IEEE Journal of Quantum Electronics, vol. 36, No. 1, 12-17 pp.

Mark Leadbeater, "Light-emitting polymer technology comes to the forefront: Polymers Shine the Light", Jun. 2002, spie's oemagazine, 14-17 pp.

Stelios Choulis et al., "The effect of interfacial layer on the performance of organic light-emitting diodes", Sep. 2005, Applied Physics Letters, vol. 87, Issue 11, 3 pp.

* cited by examiner

ORGANIC ELECTROPHOSPHORESCENCE DEVICE HAVING INTERFACIAL LAYERS

GOVERNMENT RIGHTS

This invention was made with Government support under Contract No. DE-FC26-04NT41947 awarded by the Department of Energy. The Government may have certain rights in the invention.

BACKGROUND

The invention relates to phosphorescent organic luminescent devices. Organic light emitting diodes (OLEDs) have at least one organic layer between two electrodes. The field of OLEDs is usually divided in two broad categories, small molecules (low molecular weight materials), which are processed by thermal evaporation techniques, and solution processable polymer-based OLEDs. Small molecule based OLEDs can have layers that are optimized to perform particular functions, such as charge confinement, electron and hole transport and exciton recombination (that is, bound electron-hole pairs that make up the exciton recombine). The recombination current in any of the layers of a small molecule based OLED can be controlled by incorporating electron and hole blocking layers, by varying the layer thickness and by adjusting dopant concentrations (B. W. D'Andrade and S. R. Forrest, Adv. Mater. 16, 1585, (2004)). Forming small molecule devices using the techniques described by D'Andrade can add to production cost.

Small molecule based OLEDs can include a number of layers. For example, referring to FIG. 1, OLED 100 includes a substrate 110, such as a transparent layer, for example, glass or plastic. A lower electrode, such as an anode 120, is supported by the substrate 110. The anode 120 is formed of a conducting material, such as a transparent material, for example, indium-tin-oxide (ITO). One or more organic layers, such as layers of conjugated polymers or small-molecules, are stacked on the anode 120. Typically, there are at least two organic layers, such as a transport layer and a light emitting layer 150. However, other organic layers can also be formed. In some devices, a hole injection layer 130, a hole transport layer 140, an emitting layer 150, an electron transport layer 160, and an electron injection layer 170 make up the organic layers. An upper electrode, such as cathode 180, sandwiches the organic layers with the lower electrode. The cathode 180 is formed of a metal, such as a low work function metal, e.g., calcium, barium or aluminum, or a salt, such as lithium fluoride, or a combination thereof. The anode 120, cathode 180 and organic layers form a light emitting stack 190. To cause the OLED to illuminate, a potential difference is created across a light emitting stack 190. Typically, the OLED is forward biased when the anode is positively biased and the cathode is negatively biased. This causes the anode to force holes toward the emitting layer 150 and the cathode to force electrons toward the emitting layer 150. When the electrons and holes combine, excitons form, which emit light via radiative decay. The electrons and holes combine with each other to form excitons in the recombination zone of the light emitting layer.

Solution processable polymer-based OLEDs can be formed by applying solutions including polymer materials and driving off solvent from the solution to form the organic layers. As few as two organic layers, a hole transport layer and an electron transport layer may be included in the solution processable polymer-based OLED.

OLEDs can have a light emitting layer that is formed from materials that are capable of fluorescing or phosphorescing. Phosphorescent emitters can be more efficient that fluorescent emitters, because phosphorescent materials are able to achieve emission from both singlet and triplet excited states. However, problems with phosphorescent emitters may include forming a device capable of injecting a proper ratio of holes and electrons into the emitting layer, using materials that allow for exciton quenching, including organic materials which have low conductivities and other characteristics that reduce efficiency of the device.

SUMMARY

In some implementations, the invention is directed to improving the efficiency of the injection of electrons and holes into the emitting material of an OLED by adding a matching layer on one or both sides of the light emitting layer. A matching layer has an energy level similar to that of the emitting material. In some implementations, a surface of an organic layer can be conditioned with a matching material to improve the efficiency of hole and electron transport or injection into the light emitting layer.

In some implementations, the invention is directed to improving the efficiency of an OLED by adding organic moieties to the light emitting layer. The organic moieties within the light emitting layer have energy level similar to that of the matching layers. Combinations of the techniques described herein can be used to form an OLED device.

DESCRIPTION OF DRAWINGS

Like reference symbols in the various drawings indicate like elements. The layers depicted on the OLED devices are not drawn to scale.

DETAILED DESCRIPTION

Figure 1:
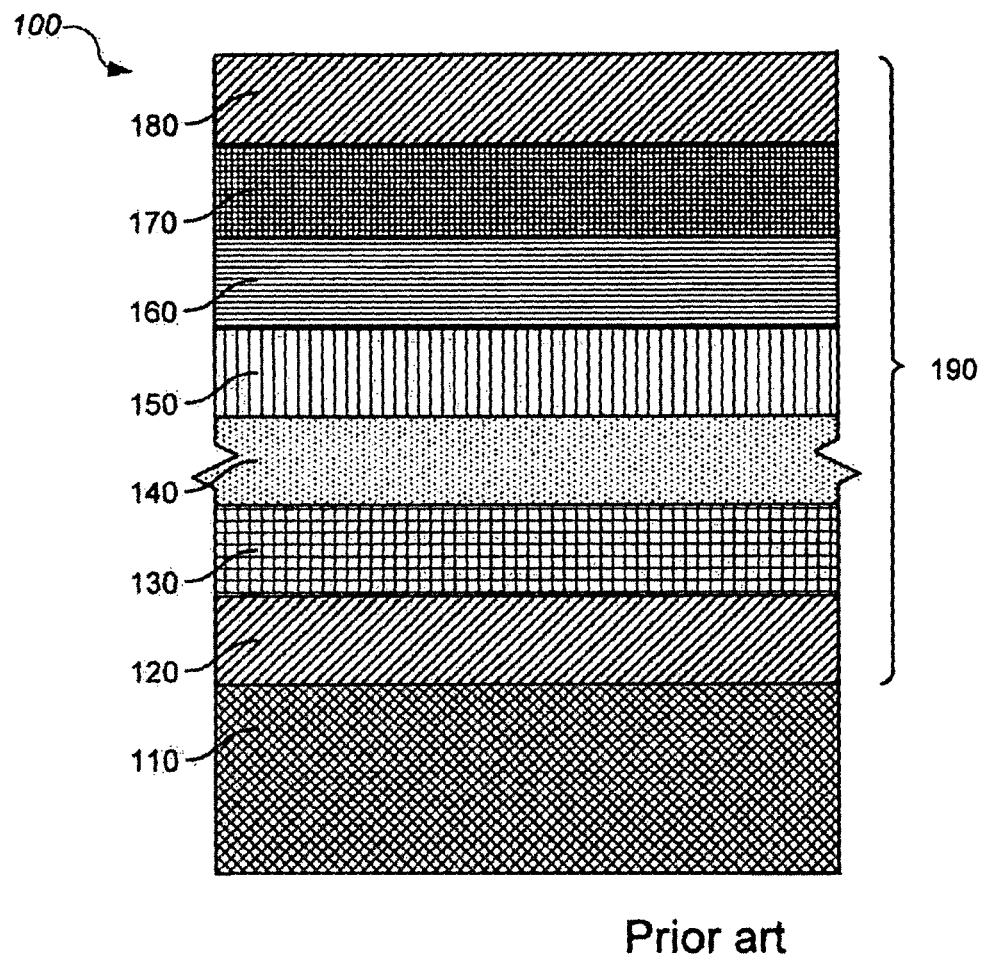
FIG. 1 is a cross-sectional view of a single OLED pixel.

The invention relates to optoelectronic devices. A light emitting diode has a first electrode, a light emitting layer coupled to the first electrode and second electrode coupled to the light emitting layer. The light emitting layer includes a phosphorescent organic material. A first interfacial layer is disposed between the light emitting layer and the first electrode, the interfacial layer having a thickness of about 3 nm or less, and the interfacial layer containing an organic material that facilitates injection of first charges into the light emitting layer.

Embodiments of the light emitting diode include none, one or more of the following features. The phosphorescent organic material has a HOMO level and a LUMO level. The first interfacial layer can have a HOMO level or a LUMO level substantially equal to the HOMO level or the LUMO level of the phosphorescent organic material, respectively. The first electrode can be an anode and the first charges can be holes. The first interfacial layer can have a HOMO level that is substantially equal to a HOMO level of the phosphorescent organic material. The first interfacial layer can include two or more matching materials, wherein a first of the matching materials has a HOMO level similar to the HOMO level of the phosphorescent organic material and a second of the matching materials has a HOMO level between the HOMO level of the phosphorescent organic material and a work function of the anode. The first interfacial layer can have a HOMO level that is within 0.2 eV, such as within 0.1 eV, of a HOMO level of the phosphorescent organic material. The first electrode can be a cathode and the first charges can be electrons. The first interfacial layer can have a LUMO level substantially equal to a LUMO level or about equal to a triplet energy level of the phosphorescent organic material. The first interfacial layer can include two or more materials, wherein a first of the matching materials has a LUMO level similar to the LUMO level of the phosphorescent organic material and a second of the matching materials has a LUMO level between the LUMO level of the phosphorescent organic material and a work function of the cathode. The first interfacial layer can have a LUMO level that is within 0.2 eV, such as within 0.1 eV, of a LUMO level or triplet energy level of the phosphorescent organic material. The diode can have a second interfacial layer disposed between the second electrode and the light emitting layer. The phosphorescent organic material can be an organo-metallic compound. The light emitting layer can include organic moieties with a HOMO level substantially equal to a HOMO level of the organo-metallic compound. The first matching layer can include the organic moieties. The light emitting layer can include organic moieties with a LUMO level substantially equal to a LUMO level or a triplet energy level of the organo-metallic compound. The first interfacial layer can include or consist of the organo-metallic compound. Layers between the cathode and anode can include small molecules, polymers or a combination thereof. The light emitting layer can include one or more of an iridium complex, a lanthanide complex, an organic triplet emitter, a porphyrin or an osmium complex.

A light emitting diode can include an anode, a first organic layer on the anode, a first interfacial layer on the hole injection layer, a light emitting layer including an organo-metallic phosphorescent compound, a second interfacial layer on the light emitting layer, a second organic layer on the second interfacial layer and a cathode on the second organic layer. The first organic layer can be a hole injecting, hole transporting, exciton blocking or electron blocking layer. The first interfacial layer can have a thickness of about 3 nm or less. The first interfacial layer can be selected to directly inject holes into the organo-metallic phosphorescent compound. A second interfacial layer can have a thickness of about 3 nm or less and can be capable of directly injecting electrons into the organo-metallic phosphorescent compound. The second organic layer can be one of an electron transport layer, an electron injection layer, an exciton blocking layer or a hole blocking layer.

Embodiments of the light emitting diode include none, one or more of the following features. The light emitting layer can be the organic layer with a conditioned surface and the matching material can have a LUMO energy level similar to a LUMO energy level or triplet energy level of the phosphorescent material or a material within the light emitting layer that injects or transports electrons into the phosphorescent material. The organic layer with a conditioned surface can be one of a hole transporting, hole injecting, exciton blocking or electron blocking layer and the matching material can have a HOMO energy level similar to a HOMO energy level of the phosphorescent material or a material within the light emitting layer that injects or transports holes into the phosphorescent material. The matching material can be the organo-metallic phosphorescent material.

A light emitting diode can include an anode, one or more organic layers on the anode, at least one of the organic layers including a light emitting layer, wherein the light emitting layer includes an organo-metallic phosphorescent material and a cathode on the light emitting layer. A surface of at least one of the one or more organic layers can be conditioned with a matching material, causing the surface of the organic layer to vary in composition from a central portion of the organic layer such that the surface has improved hole or electron injecting characteristics for injecting into the organo-metallic phosphorescent material in comparison to the central portion of the organic layer.

A method of fabricating a light emitting diode can include the following steps. A substrate with an electrode formed thereon is provided. A light emitting layer is formed on the substrate, wherein the light emitting layer includes a phosphorescent organic compound. An interfacial layer adjacent to the light emitting layer is formed, the interfacial layer having a thickness of about 3 nm or less and including a material that is capable of injecting holes or electrons directly to the phosphorescent organic compound and the interfacial layer having an HOMO level, a LUMO level similar to a HOMO level, a LUMO level or a triple energy level of at least one compound in the light emitting layer.

Embodiments of the method of fabricating a light emitting diode include none, one or more of the following features. Forming the interfacial layer can include applying a solution including a compound and washing away at least a portion of the compound with a solvent, thereby leaving a layer of the compound that is less than 3 nm thick. Forming the light emitting layer can include applying a layer including an organo-metallic phosphorescent compound and forming the interfacial layer can include forming the interfacial layer of the organo-metallic phosphorescent compound. Forming the light emitting layer can include applying a layer including an organo-metallic phosphorescent compound and organic moieties, a first of the organic moieties having a substantially equal HOMO level to a HOMO level of the organo-metallic phosphorescent compound and a second of the organic moieties having a substantially equal LUMO level to a LUMO level or triplet energy level of the organo-metallic phosphorescent compound. The interfacial layer can include at least one of the first of the organic moieties or the second of the organic moieties. Forming the interfacial layer can include vapor depositing the interfacial layer. Forming the interfacial layer can include using a solvent that is orthogonal to a solvent used to form a layer adjacent to the interfacial layer. The light emitting layer can be cross-linked.

Figure 2:
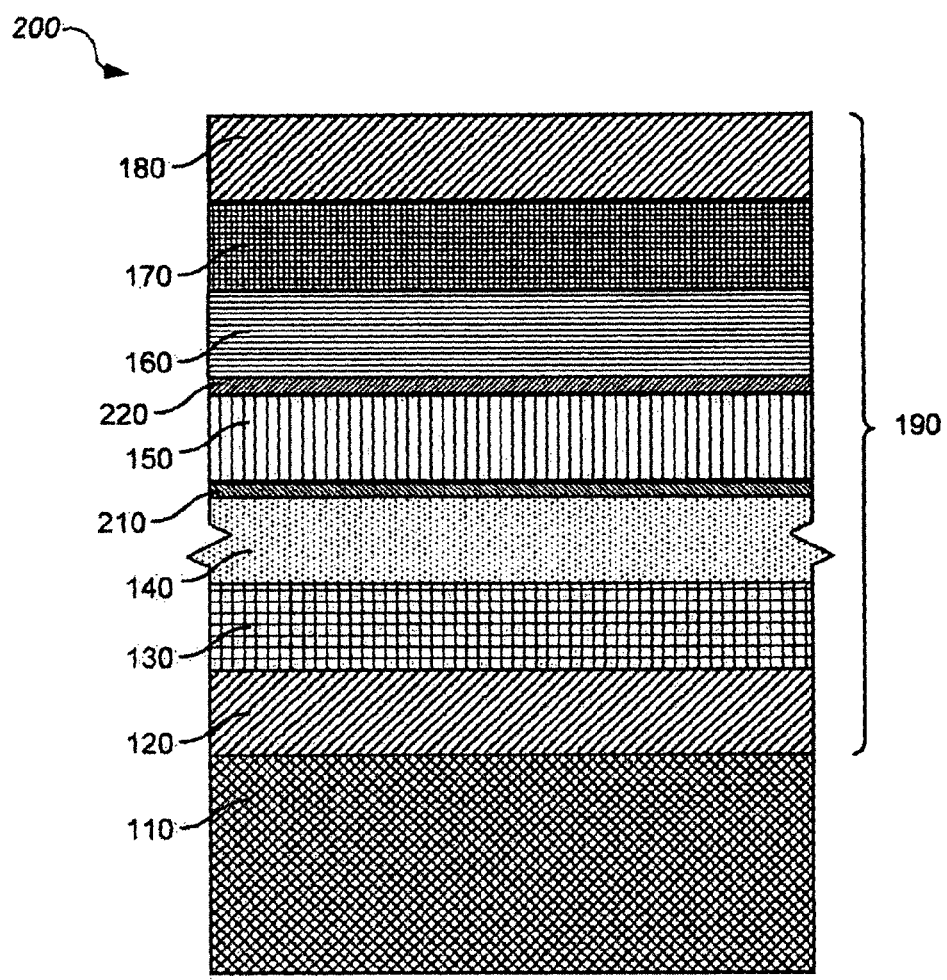
FIG. 2 is a cross-sectional view of a single OLED pixel having matching layers.

In accordance with at least one embodiment of the invention, referring to FIG. 2, an OLED 200 is manufactured with materials that directly inject holes and electrons into a component of the light emitting layer 150, such as a light emitting material or another material in the layer, as described herein. Materials used in forming OLED devices typically have properties, such as a work function, a lowest unoccupied molecular orbital level (LUMO), and/or a highest occupied molecular orbital level (HOMO) that can be quantified, at least approximately. The work function describes the minimal amount of energy that must be acquired by an electron before the electron can escape from a surface of a material. The LUMO is the lowest energy molecular orbital of a molecule that does not contain an electron. If the molecule were to accept an electron, it would be most likely to do it with this orbital. The HOMO is the highest energy molecular orbital of a molecule that contains an electron. If the molecule were to loose an electron, it would most likely loose the electron from this orbital.

Materials with a similar work function or energy level to that of the emitting material in the light emitting layer 150 are capable of efficiently injecting electrons or holes into the emitting material. In some implementations, the light emitting layer 150 includes a phosphorescent material, such as an organo-metallic compound, as a light emitting material. The materials with matching energy levels to a component in the light emitting layer 150 can be positioned adjacent to the light emitting layer to form matching layers 210, 220. Alternatively, or in addition to forming matching layers 210, 220, a matching material can be incorporated into the light emitting layer 150.

One such type of matching material injects holes into the emitting material. This matching material has a HOMO similar to that of the light emitting material. Similar, as used herein, refers to materials with energy levels within about 0.3 eV, such as within about 0.2 eV, for example, within about 0.1 eV of one another. The hole injecting matching material is referred to as a HOMO matching material. Another type of injecting material injects electrons into the light emitting material. The material has a LUMO similar to that of the light emitting material. This material is referred to as a LUMO matching material. Alternatively, the LUMO matching material can have LUMO energy level similar to a triplet energy level of the light emitting material, because the LUMO matching material can inject electrons directly to the triplet state of the light emitting material. Because the HOMO and LUMO matching materials can be formed as very thin layers between the light emitting layer and other organic layers or the electrodes, the layers can be referred to as interfacial layers.

The HOMO matching material can form a HOMO matching layer 210 between the light emitting layer 150 and the anode 120. Similarly, the LUMO material can form a LUMO matching layer 220 between the light emitting layer 150 and the cathode 180. And in some embodiments, the HOMO matching material and/or the LUMO matching material are incorporated into the light emitting layer 150. If the diode includes both matching layers and a light emitting layer co-doped with the matching material, the material that is used for the matching layers can be the same material that is used within the light emitting layer or a different material with similar energy properties.

In OLEDs that include a matching layer, such as one or both of the HOMO and LUMO matching layers, the matching layers are made very thin. The matching layers can be equal to or less than about 5 nanometers, or even less than about 3 nanometers thick, such as less than about 2 nanometers or less than 1 nanometer thick. The matching layer has a thickness greater than the width of a single atom. If the device has two matching layers, the total thickness of the two matching layers together can be equal to or less than about 10 nm, such as less than about 6 nm, less than about 5 nm, less than about 4 nm, less than about 3 nm, or less than about 2 nm, but preferably at least two molecules thick. Because the layers are so thin, they are nanoscale layers. In some embodiments, the layers are formed so thin that they are not contiguous across the surface of the light emitting layer, but are individual compounds or even moieties, e.g., functional groups, spread across the surface of an organic layer. In some instances, the matching layer can be thought of as a surface modification to the organic layer. The matching layer may comprise only a few molecules of the matching material applied to the surface of another layer, as described further herein. In some implementations, the matching material interacts with an organic layer that has been applied to a substrate and the matching material changes the electronic properties of the organic layer to which it has been applied.

In some embodiments, the matching layers include a mixture of materials with different work functions or different HOMO or LUMO energy levels. When multiple materials are used within a single layer, the materials have different energy levels to one another so that hole or electron injection can occur in stepped or graduated fashion within the layer and then the charges are eventually injected or transported into the emitting material.

Figure 3:
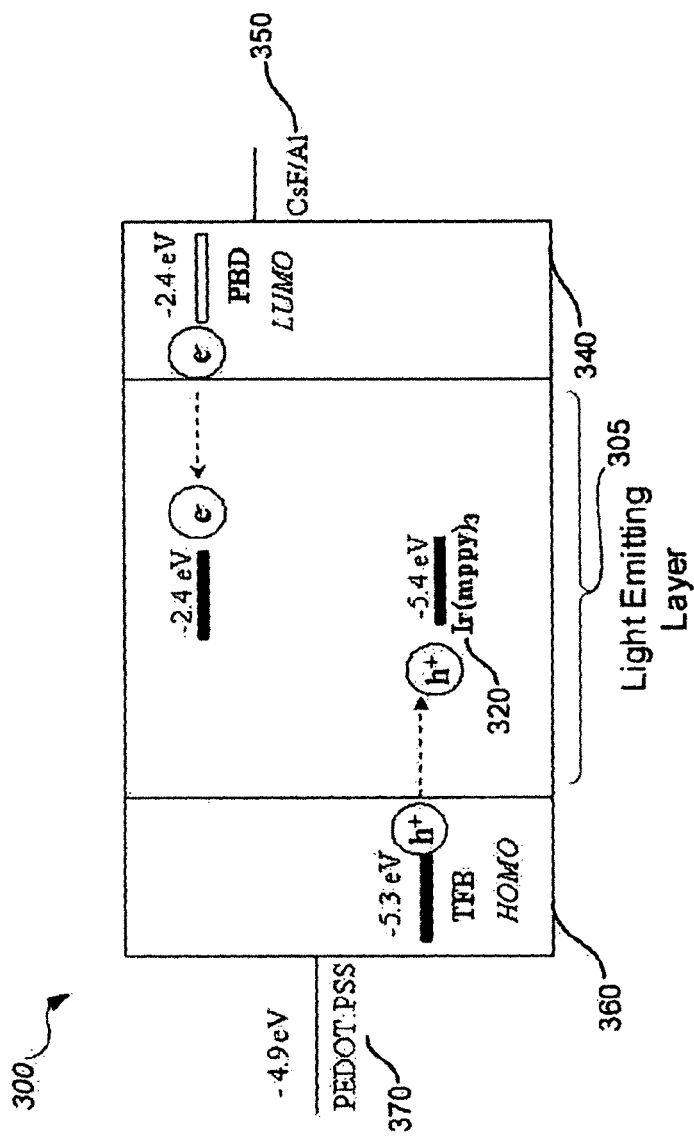
FIG. 3 is an energy diagram of materials in an OLED.

Referring to FIG. 3, thin matching layers can be formed on either side of the light emitting layer. An energy diagram 300 for an example OLED is shown, with work functions of the hole transfer material, light emitting layer material and cathode represented on the diagram 300. It is noted that all work functions/energy level numbers are approximations and are generally known to have a value plus or minus some amount of error or variation when reported.

The light emitting layer 305 includes a light emitting material 320, such as an organo-metallic phosphorescent material, a methyl-substituted tris(2-4(4-tolyl)phenylpyridine)iridium (Ir(mppy)$_3$) complex. The Ir(mppy)$_3$ has a HOMO energy level of −5.4 eV and a LUMO energy level of −2.4 eV. A matching layer of poly(9,9-dioctyl-fluorene-co-N-(4-butylphenyl)diphenylamine) (TFB) (HOMO matching layer 360), suitable for injecting holes to the Ir(mppy)$_3$, has a HOMO energy level of about −5.3 eV, approximately the same as or similar to the HOMO energy level of the Ir(mppy)$_3$. Thus, the TFB can directly inject holes into the Ir(mppy)$_3$. TFB has a HOMO energy level between the work function of an adjacent hole transport layer 370 and the phosphorescent material. The hole transport layer 370 is typically formed from a combination of poly(3,4-ethylenedioxythiophene) and polystyrenesulfonic acid (PEDOT:PSS, available as Baytron P from HC Starck). The work function of PEDOT:PSS is −4.9 eV. TFB bridges the jump between the HOMO level of the phosphorescent material and the work function of PEDOT:PSS, making the injection of holes from PEDOT:PSS to the Ir(mppy)$_3$ more favorable. In some implementations, TFB conditions the hole transport layer 370, changing the electronic properties of one of the TFB or PEDOT:PSS to provide better injection into the light emitting layer as compared with a layer of PEDOT:PSS without TFB conditioning.

A layer of 2-(4-biphenylyl-5-(4-tert-butyl-phenyl)-1,3,4-oxadiazole (PBD) (LUMO matching layer 340) is formed on the cathode side of the light emitting layer 305. PBD has a LUMO level at around −2.4 eV, which is approximately equal to that of the Ir(mppy)$_3$, and can directly inject electrons into the Ir(mppy)$_3$. The cathode layer 350 is formed of cesium fluoride and aluminum (CsF/Al) 350. The cathode layer's work function is different from the Ir(mppy)$_3$, but can inject electrons into the PBD, which forms a matching or interfacial layer on the light emitting layer 305. The PBD injects electrons into the Ir(mppy)$_3$.

Figure 4:
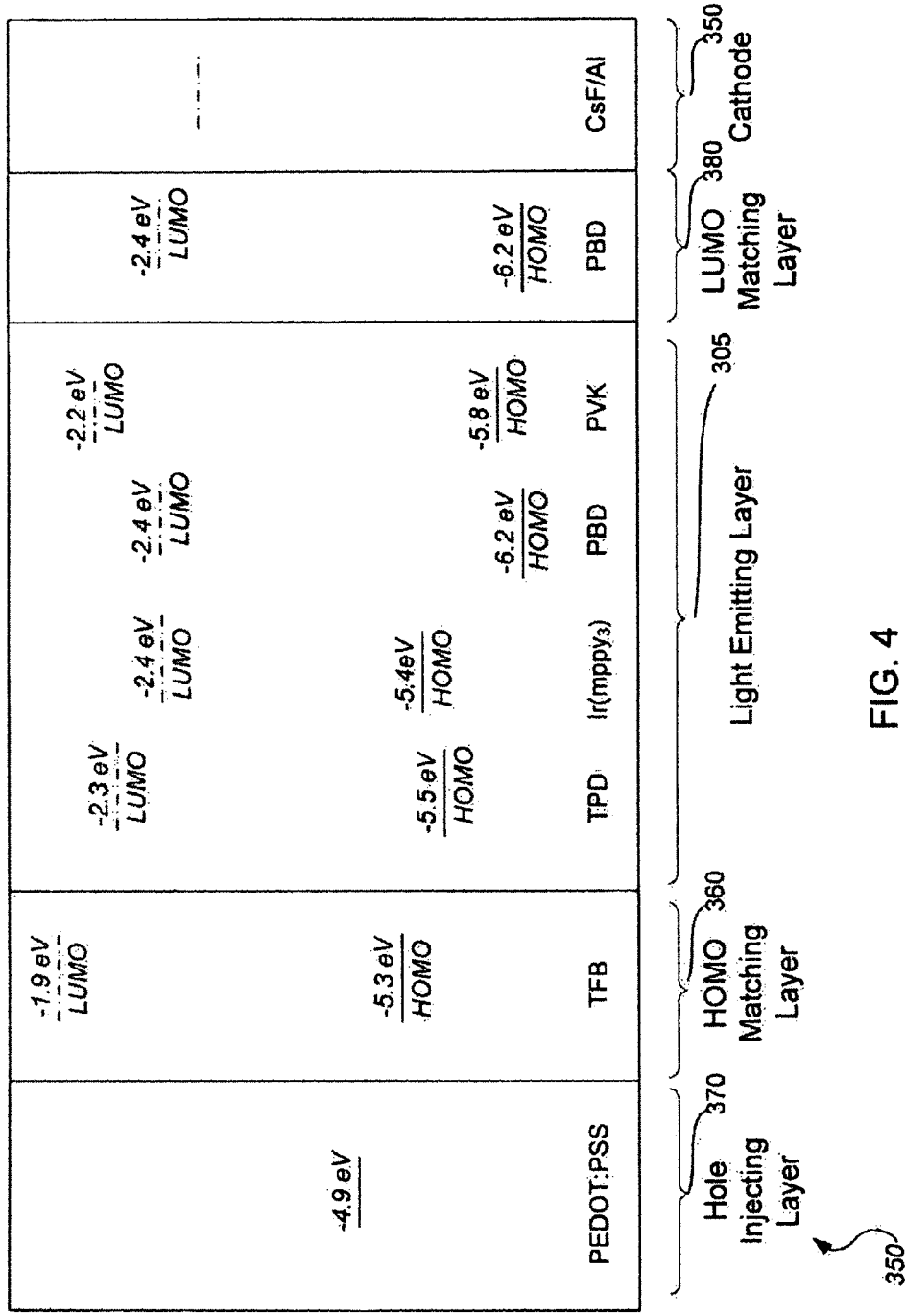
FIG. 4 is an energy diagram of materials in an OLED.

Referring to FIG. 4, organic moieties (which can include functional groups or whole molecules) can be mixed in with the light emitting layer 305 and a matching layer can be used to improve efficiencies of injecting of holes into the light emitting layer. The light emitting layer 305 includes a host material 310, poly(9-vinylcarbazole) (PVK), a light emitting material 320, (Ir(mppy)$_3$), a first organic moiety 330, triphenyldiamine (TPD) and a second organic moiety 335, PBD. The HOMO and LUMO energy levels of PVK are =2.2 eV and −5.8 eV, respectively. Thus, the PVK has a large band gap and can confine the triplet excited state of the Ir(mppy)$_3$ phosphorescent molecule, preventing luminescence quenching.

The Ir(mppy)$_3$ has a HOMO energy level of −5.4 eV and a LUMO energy level of −2.4 eV. The TPD has a HOMO level that is approximately the same as the HOMO level of Ir(mppy)$_3$, at around −5.5 eV. Thus, the TPD can either directly inject holes into the Ir(mppy)$_3$ or indirectly inject holes into the Ir(mppy)$_3$ by way of first injecting the holes to TPD in the light emitting layer. PBD has a LUMO level that is approximately equal to that of the Ir(mppy)$_3$. The PBD is used as a moiety in the light emitting layer rather than as a thin matching layer, as above. PBD is also used as a LUMO matching layer (or interfacial layer) between the light emitting layer 305 and a cathode 350. The cathode 350, hole transport layer 370 (PEDOT:PSS), and HOMO matching layer 360 (TFB) are similar to those described in FIG. 3. The materials described in FIGS. 3 and 4 are only examples of possible materials for use in an OLED. Other possible materials are discussed herein. Additional suitable materials than those described for the host material 310, the light emitting material 320, the first organic moiety 335 and the second organic moiety 335, can also be selected according to the properties described herein.

As noted herein, the light emitting layer can be co-doped with organic moieties, that is, matching material. Mixing in organic moieties can increase the recombination zone within the light emitting layer, allowing for more recombination to occur and more light to be emitted. In many OLEDs, hole and electron combination and bound electron-hole recombination occurs within a narrow band of the surface of the light emitting layer, such as within about 10 nm of the surface of the light emitting layer. When organic moieties are mixed in with the light emitting material and host, the moieties can move the holes and electrons throughout the layer, as well as inject them to the light emitting material. The holes and electrons can therefore be transferred into the core of the light emitting layer, where combination and exciton formation can occur. Thus, the organic moieties in the light emitting layer expand the recombination zone, and thus increase the efficiency of the light emitting layer over other light emitting layers in OLED devices without such moieties.

In some implementations, the first electrodes function as anodes. Anodes are conductive layers which serve as hole-injecting layers and which comprise a material with a work function typically greater than about 4.5 eV, such as in the range of about 4.8-5.1 eV. Typical anode materials include metals (such as platinum, gold, palladium, and the like); metal oxides (such as lead oxide, tin oxide, indium tin oxide (ITO), and the like); graphite; doped inorganic semiconductors (such as silicon, germanium, gallium arsenide, and the like); and doped conducting polymers (such as polyaniline, polypyrrole, polythiophene, and the like).

The first electrodes can be transparent, semi-transparent, or opaque to the wavelength of light generated within the device. The thickness of the first electrodes can be from about 10 nm to about 1000 nm, such as from about 50 nm to about 200 nm, and for example, about 100 nm. In some configurations, the first electrode layer functions as cathodes. Cathodes are conductive layers which typically serve as electron-injecting layers and which comprise a material with a low work function. The cathodes, rather than the anodes, are deposited on the substrate 110 in the case of, for example, a top-emitting OLED device.

While many materials that can function as a cathode are known to those of skill in the art, a composition that includes aluminum, indium, silver, gold, magnesium, calcium, lithium fluoride, cesium fluoride, sodium fluoride, and barium, or alloys thereof, can be utilized. Aluminum, aluminum alloys, and combinations of magnesium and silver or their alloys can also be utilized. In some embodiments, cathodes are fabricated by thermally evaporating in a three layer fashion lithium fluoride, calcium and aluminum in various amounts.

The first electrode layer and second electrode layer, can typically be fabricated using any of the techniques known in the art for depositing thin films, including, for example, vacuum evaporating, sputtering, electron beam depositing, plasma deposition or chemical vapor depositing techniques. The total thickness of the second electrodes can be from about 10 to about 1000 nanometers (nm), such as from about 50 to about 500 nm, for example, from about 100 to about 300 nm.

One or more organic materials are deposited to form one or more organic layers of an organic stack. The organic stack is in contact with the first electrodes. As used herein, the organic stack is coupled with the electrodes. The term coupled, as used herein to described layers of the device, describes layers adjacent to one another or in close proximity to one another, such as with one or more layers between the two coupled layers. The term "on" means directly on or over and not necessarily directly contacting. The organic stack typically includes at least a hole injection/anode buffer layer ("HIL/ABL") and light emitting layer. If the first electrodes are anodes, then the HIL/ABL is on the first electrodes. Alternatively, if the first electrodes are cathodes, then the active electronic layer is on the first electrodes, and the HIL/ABL is on the light emitting layer.

The HIL/ABL has good hole conducting properties and is used to effectively inject holes from the first electrodes to the emitting material. The HIL/ABL is typically made of polymers or small molecule materials. For example, the HIL/ABL can be made of tertiary amine or carbazole derivatives both in their small molecule or their polymer form, conducting polyaniline ("PANI"), or PEDOT:PSS. The HIL/ABL can have a thickness from about 5 nm to about 1000 nm, and is typically from about 50 to about 250 nm.

Other examples of the HIL/ABL include any small molecule materials and the like, such as plasma polymerized fluorocarbon films (CFx) with a thickness between about 0.3 and 3 nm, or copper phthalocyanine (CuPc) films with a thickness between about 10 and 50 nm.

The HIL/ABL can be formed using selective deposition techniques or nonselective deposition techniques. Examples of selective deposition techniques include, for example, ink jet printing, flex printing, and screen printing. Examples of nonselective deposition techniques include, for example, spin coating, dip coating, web coating, and spray coating. A hole transporting and/or buffer material is deposited on the first electrodes and then allowed to dry into a film. The dried film represents the HIL/ABL. Other deposition methods for the HIL/ABL include plasma polymerization (for CFx layers), vacuum deposition, or vapor phase deposition (e.g., for films of CuPc).

For OLEDs, the light emitting layer contains at least one organic material that emits light. The polymers may be organic or organo-metallic in nature. It is understood that when referring to some devices, the term organic also includes organo-metallic materials. Light-emission in these materials may occur as a result of fluorescence or phosphorescence or both. The light emitting organic polymers in the light emitting layer can be, for example, EL polymers having a conjugated repeating unit, in particular EL polymers in which neighboring repeating units are bonded in a conjugated manner, such as polythiophenes, polyphenylenes, polythiophenevinylenes, or poly-p-phenylenevinylenes or their families, copolymers, derivatives, or mixtures thereof. More specifically, organic polymers can be polyfluorenes, poly-p-phenylenevinylenes that emit white, red, blue, yellow, or green light, and are 2-, or 2,5-substituted poly-p-pheneylenevinylenes or polyspiro polymers.

Polymers can be solvated in an organic solvent, such as toluene or xylene, and spun (spin-coated) onto the device, although other deposition methods, such as those described above are possible too.

In accordance with embodiments of the invention, small organic molecules that emit by fluorescence or by phosphorescence can serve as a light emitting material residing in the light emitting layer. Unlike polymeric materials that are applied as solutions or suspensions, small-molecule light emitting materials are preferably deposited through evaporation, sublimation, or organic vapor phase deposition methods. There are also small molecule materials that can be applied by solution methods too. Combinations of PLED materials and smaller organic molecules can also serve as an active electronic layer thereby forming a hybrid device. For example, a PLED may be chemically derivatized with a small organic molecule or simply mixed with a small organic molecule to form the light emitting layer. Examples of electroluminescent small molecule materials include chelates, such as tris(8-hydroxyquinolate) aluminum ($Alq_3$) and tris(2-phenylpyridine) iridium ($Ir(ppy)_3$), organic materials, such as anthracene, rubrene or triazine, or any metal-chelate compounds or derivatives of any of the organic materials or small molecule materials.

The light emitting layer can include a host material. The hole material can be PVK, as described above, which is a non-conjugated polymer having mostly hole transporting properties. The host can be also a electron, hole or bipolar transporting material, can have a high band gap (have a large difference between their HOMO and LUMO levels), can be a polymer, small molecules or a mixture of a polymer with small molecules. In some embodiments, the phosphorescent compounds are used without a host, that is, the light emitting layer does not include a host. In some embodiments, the light emitting layer includes materials that are insulated matrices, that is, the host does not have transport properties, such as polycarbonate (PC), polymethyl methacrylate (PMMA) or polystyrene sulphonate (PSS).

In addition, the light emitting layer can include a material capable of charge transport. Charge transport materials include polymers or small molecules that can transport charge carriers. For example, organic materials such as polythiophene, derivatized polythiophene, oligomeric polythiophene, derivatized oligomeric polythiophene, pentacene, triphenylamine, and triphenyldiamine.

Other organic layers can include a hole transport layer for assisting in injection of holes into the light emitting layer, reducing exciton quenching (e.g., dissociation of the bound electron-hole pair that makes up the exciton) at the anode, providing better hole transport than electron transport, and blocking electrons from entering the HIL/ABL and degrading it. Some materials may have one or two of the aforementioned desired properties, but the effectiveness of the material as an interlayer is believed to improve with the number of these properties exhibited. Through careful selection of the hole transporting material, an efficient interlayer material can be found. The hole transfer layer is fabricated from a hole transporting material that may consist at least partially of or may derive from one or more following compounds, their derivatives, moieties, etc: polyfluorene derivatives, poly(2,7-(9,9-di-n-octylfluorene)-(1,4-phenylene-((4-secbutylphenyl) imino)-1,4-phenylene) and derivatives which include cross-linkable forms, non-emitting forms of poly(p-phenylenevinylene), triarylamine type material (e.g., TPD or α-napthylphenyl-biphenyl (NPB)), thiopene, oxetane-functionalized polymers and small molecules etc. In some embodiments of the invention, the hole transfer layer is fabricated using a cross-linkable hole transporting polymer.

An electron injection or transport layer can be formed from materials having one or more aluminum $Alq_3$, PBD, 3,5-Diphenyl-4-naphth-1-yl-1,2,3-triazole (TAZ) and 1,3-bis(N, N-t-butyl-phenyl)-1,3,4-oxadiazole (OXD7).

Polymer organic layers can be applied to the substrate using a variety of techniques, such as ink-jet printing an organic solution or by spin-coating. Alternatively, if small molecule materials are used instead of polymers, the layers can be deposited through evaporation, sublimation, organic vapor phase deposition, or in combination with other deposition techniques. When a layer is deposited on the substrate, the layer may be directly on the substrate or separated from the substrate by other layers, such as the pocket layer or planarization layer described below. An organic solution that is applied can be any fluid or deformable mass capable of flowing under pressure and may include solutions, inks, pastes, emulsions, dispersions, foams, gels, suspensions, and so on. A liquid can contain or be supplemented by further substances which affect the viscosity, contact angle, thickening, affinity, drying, dilution and so on of the deposited drops.

Further, any or all of the layers may be cross-linked or otherwise physically or chemically hardened as desired for stability and maintenance of certain surface properties desirable for deposition of subsequent layers.

In diodes having a matching layer, the layer can be formed as a very thin layer. Various methods are available for forming a sufficiently thin layer. In one method, the material that is to form the matching layer is applied in a solution to a substrate. Other layers may already have been applied to the substrate prior to applying the solution having the matching material. The layer can be formed using any appropriate solution application method, such as spin coating or printing. The solution includes a solvent in addition to the matching material. After the layer has been applied to the substrate, the solvent in the solution can be used to remove most of the solution from the substrate. The solvent removes all but a very thin layer of the matching layer material.

If the solvent that is used to remove the excess matching layer solution from the substrate is able to dissolve any layers underlying the matching layer, control of layer uniformity and thickness can be lost. In many cases, multiple organic layers that are applied to form an OLED are soluble in the same solvent. Therefore, the solvent removal method may not be ideal for applying a thin matching layer over a light emitting layer when the light emitting layer is soluble in the same solvent. An alternative method of applying the matching layer can therefore be used. The matching layer can be applied by vapor deposition or thermal evaporation. In some implementations, vapor deposition is used to apply the matching layer on both sides of the light emitting layer.

In some implementations, the matching material is applied in a solvent that is orthogonal to a solvent that is used to apply an adjacent organic layer, such as the light emitting layer. When two solvents are orthogonal to one another, a solute that is soluble in one of the solvents is not soluble in the other solvent. Using layers that are applied in orthogonal solvents prevents dissolution of layers that have been applied beneath a subsequent layer. For example, the light emitting layer can be formed of toluene or other organic solvents that are used to dissolve light emitting material and the matching layers can be water soluble or methanol soluble organic materials. Casting a subsequent layer, e.g., a matching layer, that is formed of a water or methanol solution over an existing layer, e.g., the light emitting layer, that was formed from a toluene-based solution does not dissolve the existing layer. In some implementations, if using materials that are soluble in orthogonal material is not feasible, the lower organic layer, such as the light emitting layer, is crosslinked to prevent dissolution of the layer by subsequently applied layers.

As noted herein, the methods of forming the very thin layers can be considered to modify the surface of an already existing layer instead of forming a layer unto themselves. A surface of an existing layer can be changed, such as by mixing the matching material into the surface or by a chemical reaction between the material in the existing layer and the matching material. The surface conditioning causes the surface of the existing layer to differ in composition from other portions of the layer, such as a central region of the layer or a non-modified surface. For example, applying TFB over a layer of PEDOT:PSS may merely change the condition of the surface of the PEDOT:PSS layer rather than merely add a layer of TFB or mix the PEDOT:PSS and TFB. Surface conditioning may alter the electronic properties of PEDOT:PSS, creating an anode with electric properties that allows for step-like transfer of holes (e.g., transferred between materials having similar HOMO energy levels until the holes are eventually injected into the light emitting material where an exciton forms). Other surface modifications can be performed with other layers and other materials. For example, the surface of the light emitting layer can be modified with the PBD.

EXAMPLE

Figure 5:
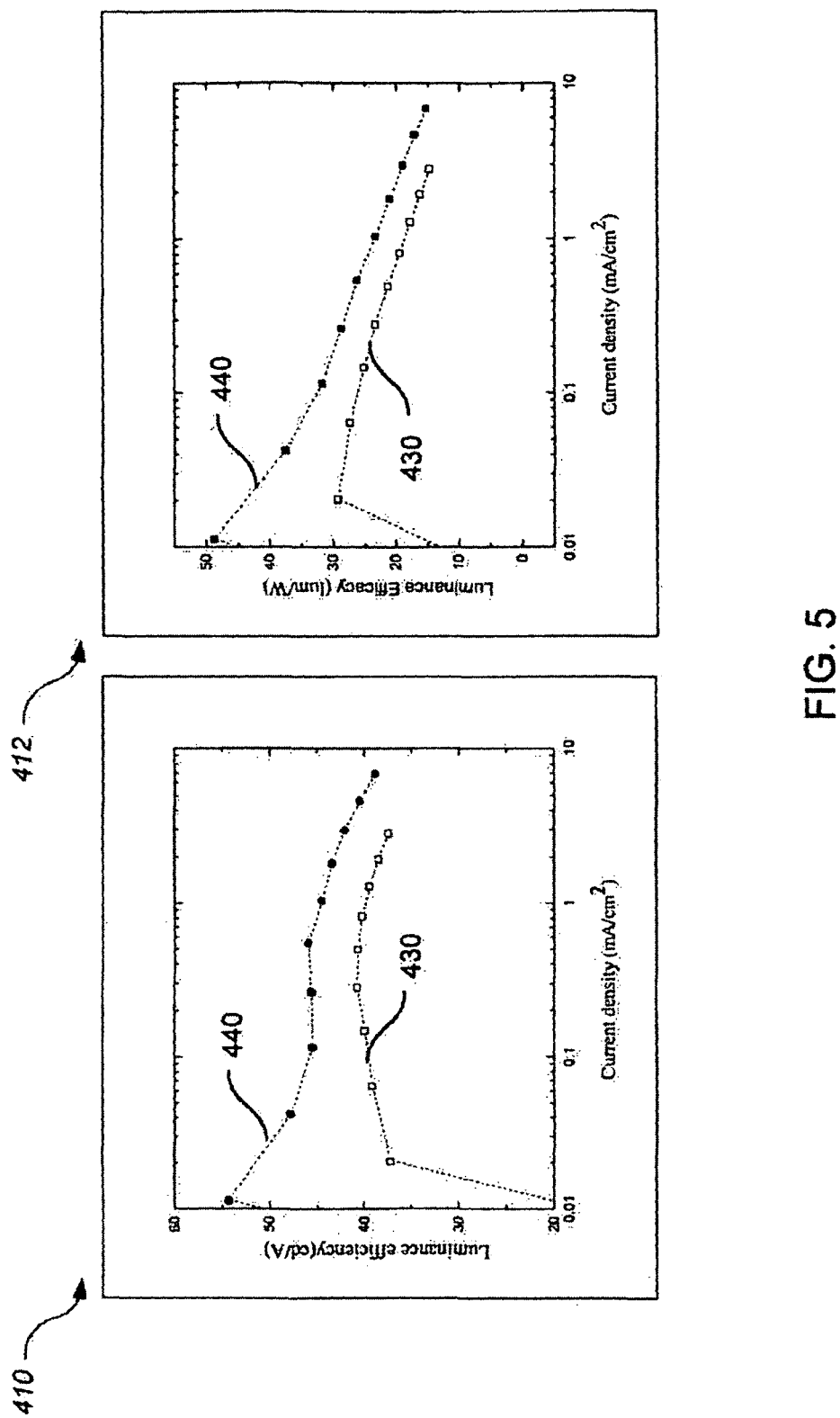
FIG. 5 includes a performance graph for each of two OLED devices.

Referring to FIG. 5, a light emitting device having a phosphorescent light emitting compound is formed with and without matching layers. A control device 430 (without matching layers) is formed with an anode of ITO, a hole transport layer of PEDOT:PSS, a light emitting layer, and a cathode of CsF/Al. The light emitting layer includes 61% PVK, 24% PBD, 9% TPD and 6% Ir(mppy)$_3$. In a matching layer device 440, matching layers are formed to directly inject holes and electrons to the Ir(mppy)$_3$. The matching layer device 440 is formed with the same layers and dimensions as the control device, but also includes a layer of TBF and a layer of PBD. The layer of TFB, which has a similar HOMO energy level to Ir(mppy)$_3$, is between the light emitting layer and the hole transport layer of PEDOT:PSS. The layer of PBD, which has a LUMO level similar to that of Ir(mppy)$_3$, is between the light emitting layer and the cathode. The matching layer device 440 has an increased external quantum efficiency and power efficiency over the control device 430. Graph 430 compares current density (mA/cm$^2$) to luminance efficiency (Cd/A) and graph 412 compares current density (mA/cm$^2$) to luminance efficacy or power conversion efficiency (lm/W). Graphs 410 and 412 shows the peak luminance efficacy power of the control device 430 as 29 lum/Watt and luminance efficiency reaching 40 cd/A. The matching layer device 440 had a peak luminance efficacy of about 50 lm/W and luminescence efficiencies reaching about 55 cd/A.

Ideally, the work function of the electrodes would match the HOMO and LUMO level of the emitting material. Because ideal electrode and emitting material combinations are not common, there can be an energy difference between the materials that prevents efficient transmission of holes and electrons to the emitting material. This energy barrier can impair light emission and reduce the device's efficiency. Adding the matching layers and/or organic moieties to the device's organic layers can enable direct injection of holes and electrons without greatly increasing the overall thickness of the diode and the required voltage to drive the diode. Other solutions to improving device efficiency can include adding thick layers of hole or electron injection material, such as layers that are 10 nm or more thick, to the device. Such a solution can complicate the structure and increase operating voltage for the device, thereby deteriorating device efficiency. One parameter for high power efficiencies is low voltage operating, which can be achieved with the structures described herein. That is, incorporating ultrathin electron and hole injecting layers (matching layers) or conditioning the interfaces on the cathode and anode sides of the light emitting layer can form a highly efficient device.

Incorporating molecules into the light emitting layer that are either formed from the same material as in the matching layers, or from organic materials which have a similar energy level to the matching material can expand the recombination zone within the light emitting layer. Without the matching materials within the light emitting layer, the phosphorescent material transfers holes and electrons. In addition, the phosphorescent material is promoting exciton formation. By shifting the hole and electron transfer to the matching materials in the light emitting material, charge transport can be separated from exciton formation. The phosphorescent material can primarily be devoted to exciton formation and recombination of bound hole-electron pairs that make up the exciton if the matching materials are also present in the light emitting layer. More efficient use of the phosphorescent material may require less voltage application to the device overall. Also, in conventional devices where phosphorescent material is responsible for transferring the holes and electrons, exciton formation may be more likely to occur at the surface of the light emitting layer, such as within the first 10 nm of the surface. Expanding the recombination zone allows for exciton formation throughout the light emitting layer.

Incorporating molecules into the light emitting layer that are either formed from the same material as matching layers or have a similar energy level to the matching material can not only expand the recombination zone within the light emitting layer, but can also extend the lifetime of the device. Without the matching materials within the light emitting layer, the phosphorescent material performs much of the hole and electron transfer functions. In addition, the phosphorescent material is the location for exciton formation. By shifting part of the hole and electron transfer to matching materials in the light emitting material, charge transport can be separated from exciton formation. Thus, the lifetime of the phosphorescence device may be increased.

Further, by using a specific amount of hole and electron injecting materials within the light emitting layer, the change balance within the light emitting layer can be optimized. Incorporating matching layers into the light emitting layer can also control the charge balance within the light emitting layer. For example, if the light emitting layer is hole dominant, adding an electron injecting matching layer can increase the amount of electrons in the light emitting layer. Less charge may be required to drive the device because the hole and electron transport is optimized. Optimized charge balance within the light emitting layer can increase the lifetime of the device. It is noted that in selecting a material for the LUMO or HOMO materials for forming thin matching layers, the energy levels of the material may be more important than the transport properties of the material for forming a device with high power efficiencies.

A number of embodiments of the invention have been described. Nevertheless, it will be understood that various modifications may be made without departing from the spirit and scope of the invention. For example, the techniques described herein can be applied to small molecule OLEDs, solution processable polymer-based OLEDs, or OLEDs that are a hybrid of the two. The matching layers can have exciton blocking or electron blocking properties. Alternatively, or in addition, the device can include an exciton blocking layer and/or an electron blocking layer. Accordingly, other embodiments are within the scope of the following claims.

What is claimed is:

1. A light emitting diode, comprising:
   a first electrode;
   a light emitting layer coupled to the first electrode, the light emitting layer including a phosphorescent organic compound and a host material;
   a second electrode coupled to the light emitting layer; and
   a first interfacial layer disposed between the light emitting layer and the first electrode, the interfacial layer having a thickness of about 3 nm or less, the interfacial layer containing a matching material that facilitates direct injection of first charges into the light emitting layer and that is different from the phosphorescent organic compound, and the interfacial layer not including the host material included in the light emitting layer.

2. The light emitting diode of claim 1, wherein:
   the phosphorescent organic compound has a HOMO level and a LUMO level; and
   the matching material contained in the first interfacial layer has a HOMO level or a LUMO level substantially equal to the HOMO level or the LUMO level of the phosphorescent organic compound, respectively.

3. The light emitting diode of claim 1, wherein:
   the first electrode is an anode; and
   the first charges are holes.

4. The light emitting diode of claim 3, wherein the first interfacial layer has a HOMO level that is substantially equal to a HOMO level of the phosphorescent organic compound.

5. The light emitting diode of claim 3, wherein the first interfacial layer includes two or more matching materials, wherein a first of the matching materials has a HOMO level similar to the HOMO level of the phosphorescent organic compound and a second of the matching materials has a HOMO level between the HOMO level of the phosphorescent organic compound and a work function of the anode.

6. The light emitting diode of claim 3, wherein the first interfacial layer has a HOMO level that is within 0.2 eV of a HOMO level of the phosphorescent organic compound.

7. The light emitting diode of claim 1, wherein:
   the first electrode is a cathode; and
   the first charges are electrons.

8. The light emitting diode of claim 7, wherein the first interfacial layer has a LUMO level substantially equal to a LUMO level or about equal to a triplet energy level of the phosphorescent organic compound.

9. The light emitting diode of claim 7, wherein the first interfacial layer includes two or more matching materials, wherein a first of the matching materials has a LUMO level similar to the LUMO level or about equal to a triplet energy level of the phosphorescent organic compound and a second of the matching materials has a LUMO level between the LUMO or the triplet energy level of the phosphorescent organic compound and a work function of the cathode.

10. The light emitting diode of claim 7, wherein the first interfacial layer has a LUMO level that is within 0.2 eV of a LUMO level or triplet energy level of the phosphorescent organic compound.

11. The light emitting diode of claim 7, further comprising a second interfacial layer disposed between the second electrode and the light emitting layer, wherein:
    the second interfacial layer has a thickness of about 3 nm or less and contains an organic material that facilitates injection of holes into the light emitting layer.

12. The light emitting diode of claim 1, wherein the phosphorescent organic compound is an organo-metallic compound.

13. The light emitting diode of claim 12, wherein the light emitting layer includes organic moieties with a HOMO level substantially equal to a HOMO level of the organo-metallic compound.

14. The light emitting diode of claim 13, wherein the first interfacial layer comprises the organic moieties.

15. The light emitting diode of claim 12, wherein the light emitting layer includes organic moieties with a LUMO level substantially equal to a LUMO level or a triplet energy level of the organo-metallic compound.

16. The light emitting diode of claim 15, wherein the first interfacial layer comprises the organic moieties.

17. The light emitting diode of claim 12, wherein the first interfacial layer comprises the organo-metallic compound.

18. The light emitting diode of claim 1, wherein layers between the cathode and anode include at least one of a small molecule or a polymer.

19. The light emitting diode of claim 1, wherein layers between the cathode and anode include at least one polymer and at least one small molecule.

20. The light emitting diode of claim 1, wherein the light emitting layer includes one or more of an iridium complex, a lanthanide complex, an organic triplet emitter, a porphyrin or an osmium complex.

21. A light emitting diode, comprising:
    an anode;
    a first organic layer on the anode, wherein the first organic layer is one of a hole injecting, hole transporting, exciton blocking or electron blocking layer;
    a first interfacial layer directly on the first organic layer, the first interfacial layer having a thickness of about 3 nm or less;
    a light emitting layer including an organo-metallic phosphorescent compound, wherein the first interfacial layer is selected to directly inject holes into the organo-metallic phosphorescent compound;
    a second interfacial layer on the light emitting layer, wherein the second interfacial layer has a thickness of about 3 nm or less, is capable of directly injecting electrons into the organo-metallic phosphorescent compound and the first interfacial layer and the second interfacial layer each includes a matching material that is different from the phosphorescent compound of the light emitting layer and different from the material of the respective adjacent first or second organic layer;
    a second organic layer directly on the second interfacial layer, wherein the second organic layer is one of an electron transport, an electron injecting, an exciton blocking or a hole blocking layer; and
    a cathode on the second organic layer.

22. A light emitting diode, comprising:
    an anode;
    one or more organic layers on the anode, at least one of the organic layers including a light emitting layer, wherein the light emitting layer includes an organo-metallic phosphorescent material and a host material; and
    a cathode on the light emitting layer;

wherein a surface of at least one organic layer of the one or more organic layers has been conditioned with a matching material, causing the surface of the organic layer to vary in composition from a central portion of the organic layer such that the surface has improved hole or electron injecting characteristics for directly injecting into the organo-metallic phosphorescent material in comparison to the central portion of the organic layer and the matching material is different from the phosphorescent material and does not include the host material included in the light emitting layer.

23. The diode of claim 22, wherein:
the light emitting layer is the organic layer with a conditioned surface; and
the matching material has a LUMO energy level similar to a LUMO energy level or triplet energy level of the phosphorescent material or a material within the light emitting layer that injects or transports electrons into the phosphorescent material.

24. The diode of claim 22, wherein:
the organic layer with a conditioned surface is one of a hole transporting, hole injection, exciton blocking or electron blocking or electron confinement layer; and
the matching material has a HOMO energy level similar to a HOMO energy level of the phosphorescent material or a material within the light emitting layer that injects or transports holes into the phosphorescent material.

25. The diode of claim 22, wherein the matching material is the organo-metallic phosphorescent material.

26. The light emitting diode of claim 1, wherein the light emitting layer includes the matching material.

27. The light emitting diode of claim 1, wherein the host material is an electron, hole or bipolar transporting material or an insulated matrix without charge transport properties.

28. The light emitting diode of claim 1, wherein the matching material has either a LUMO energy level within 0.3 eV of a LUMO energy level of the phosphorescent organic compound or the host material or a HOMO energy level that is within 0.3 eV of a HOMO energy level of the phosphorescent organic compound or the host material.

29. A light emitting diode, comprising:
an electrode;
a light emitting layer coupled to the electrode, the light emitting layer including a phosphorescent organic material and not including a host material;
a second electrode coupled to the light emitting layer; and
an interfacial layer disposed between the light emitting layer and the electrode, the interfacial layer having a thickness of about 3 nm or less, the interfacial layer containing a matching material that facilitates direct injection of charges into the light emitting layer, the interfacial layer not including the phosphorescent organic material included in the light emitting layer.

30. A light emitting diode, comprising:
an electrode;
a light emitting layer coupled to the electrode, the light emitting layer including a phosphorescent organic material and not including a host material;
an organic layer disposed between the light emitting layer and the electrode;
a second electrode coupled to the light emitting layer; and
an interfacial layer disposed between the light emitting layer and the organic layer and directly arranged on the organic layer, the interfacial layer having a thickness of about 3 nm or less, the interfacial layer containing a matching material that facilitates direct injection of charges into the light emitting layer and that is different from the phosphorescent organic material included in the light emitting layer, different from the host material included in the light emitting layer and different from the material of the organic layer.

31. The light emitting diode of claim 30, wherein the electrode is an anode and the organic layer is one of a hole injecting, hole transporting, exciton blocking, electron blocking layer or wherein the electrode is a cathode and the organic layer is one of an electron transport, an electron injecting, an exciton blocking or a hole blocking layer.

* * * * *

UNITED STATES PATENT AND TRADEMARK OFFICE
CERTIFICATE OF CORRECTION

PATENT NO.       : 7,772,761 B2
APPLICATION NO.  : 11/238888
DATED            : August 10, 2010
INVENTOR(S)      : Stelios Choulis et al.

It is certified that error appears in the above-identified patent and that said Letters Patent is hereby corrected as shown below:

OTHER PUBLICATIONS, page 2, column 1, line 7, delete "1994" and insert -- 1998 --.

Signed and Sealed this

Thirtieth Day of November, 2010

David J. Kappos
*Director of the United States Patent and Trademark Office*